United States Patent
Lo et al.

(10) Patent No.: US 10,340,343 B2
(45) Date of Patent: Jul. 2, 2019

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Wen-Shun Lo, Hsinchu County (TW); Yu-Chi Chang, Kaohsiung (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/862,489

(22) Filed: Jan. 4, 2018

(65) Prior Publication Data
US 2019/0131401 A1 May 2, 2019

Related U.S. Application Data

(60) Provisional application No. 62/579,513, filed on Oct. 31, 2017.

(51) Int. Cl.
*H01L 29/10* (2006.01)
*H01L 29/78* (2006.01)
(Continued)

(52) U.S. Cl.
CPC .... *H01L 29/1041* (2013.01); *H01L 21/26513* (2013.01); *H01L 21/26586* (2013.01);
(Continued)

(58) Field of Classification Search
CPC ............ H01L 21/76237; H01L 29/1041–1045
See application file for complete search history.

(56) References Cited

U.S. PATENT DOCUMENTS 6,562,697 B1 * 5/2003 Cho ................... H01L 21/76237
257/E21.551
2006/0141724 A1 6/2006 Kim
(Continued)

FOREIGN PATENT DOCUMENTS

TW 445548 7/2001

OTHER PUBLICATIONS

Office Action and Search Report dated Nov. 12, 2018 issued by the Taiwan Intellectual Property Office (TIPO) for counterpart application No. 107114294.
(Continued)

*Primary Examiner* — Daniel P Shook
(74) *Attorney, Agent, or Firm* — WPAT, P.C., Intellectual Property Attorneys; Anthony King

(57) ABSTRACT

A semiconductor device includes a semiconductor substrate, a gate electrode, a pair of source/drain regions and a a threshold voltage adjusting region. The gate electrode is over the semiconductor substrate. The channel region is between the semiconductor substrate and the gate electrode. The source/drain regions are adjacent to two opposing sides of the channel region in a channel length direction. The threshold voltage adjusting region is adjacent to two opposing sides of the channel region in a channel width direction, wherein the threshold voltage adjusting region and the channel region have the same doping type.

19 Claims, 14 Drawing Sheets

(51) Int. Cl.
　　　*H01L 21/762*　　(2006.01)
　　　*H01L 21/265*　　(2006.01)
　　　*H01L 29/66*　　(2006.01)
(52) U.S. Cl.
　　　CPC .. *H01L 21/76237* (2013.01); *H01L 29/66568* (2013.01); *H01L 29/78* (2013.01); *H01L 29/7833* (2013.01)

(56) References Cited

U.S. PATENT DOCUMENTS

| | | |
|---|---|---|
| 2007/0077707 A1 | 4/2007 | Jung |
| 2008/0090364 A1 | 4/2008 | Ema et al. |
| 2014/0035055 A1 | 2/2014 | Shinohara et al. |
| 2016/0005754 A1 | 1/2016 | Park |
| 2017/0200656 A1 | 7/2017 | Li |

OTHER PUBLICATIONS

2nd Office Action and Search Report dated Mar. 8, 2019 by the Taiwan Intellectual Property Office (TIPO) for counterpart application No. 107114294.

* cited by examiner

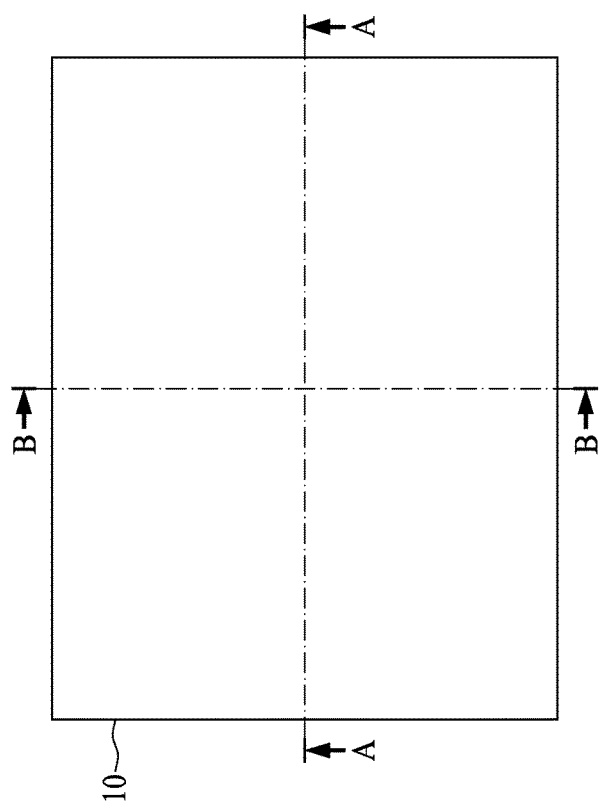
FIG. 2
FIG. 2B
FIG. 2A

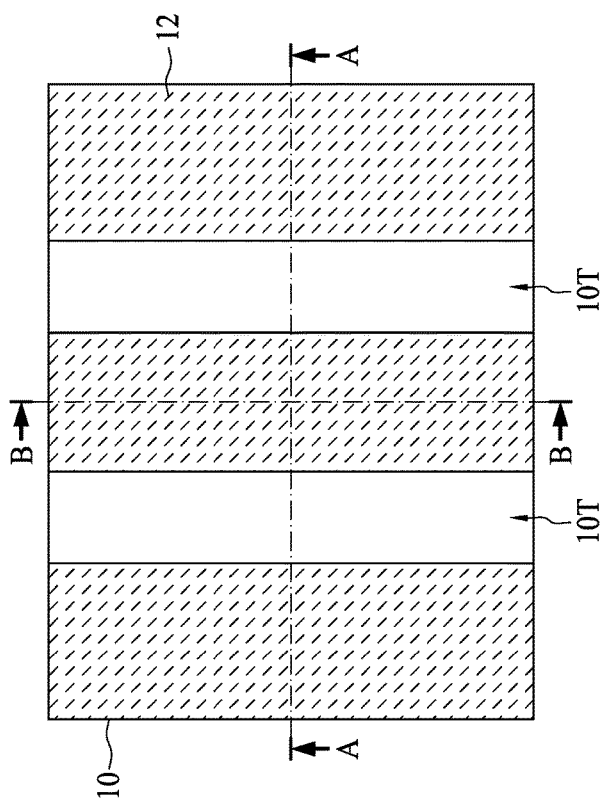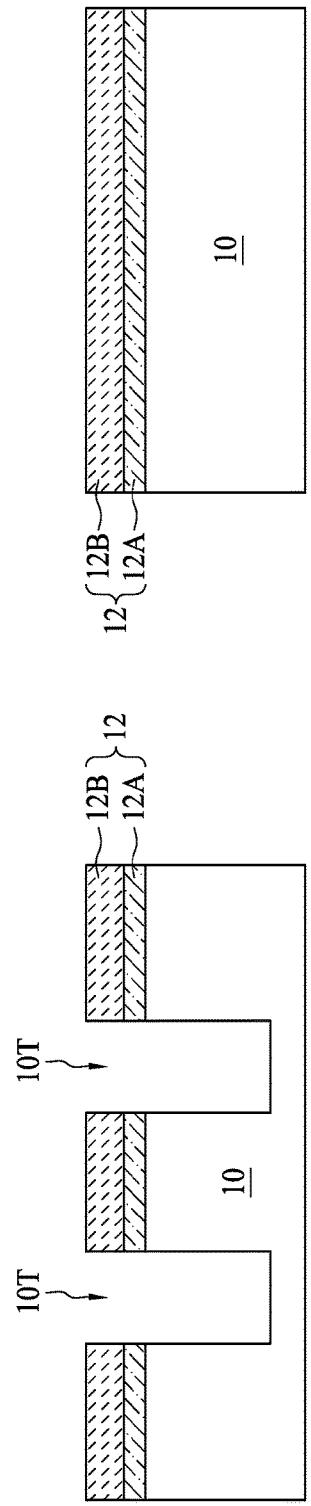

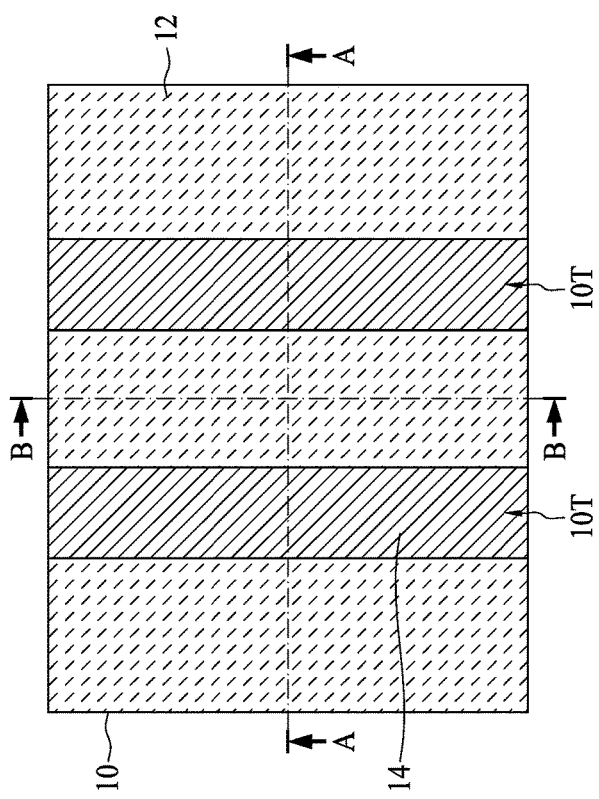
FIG. 4
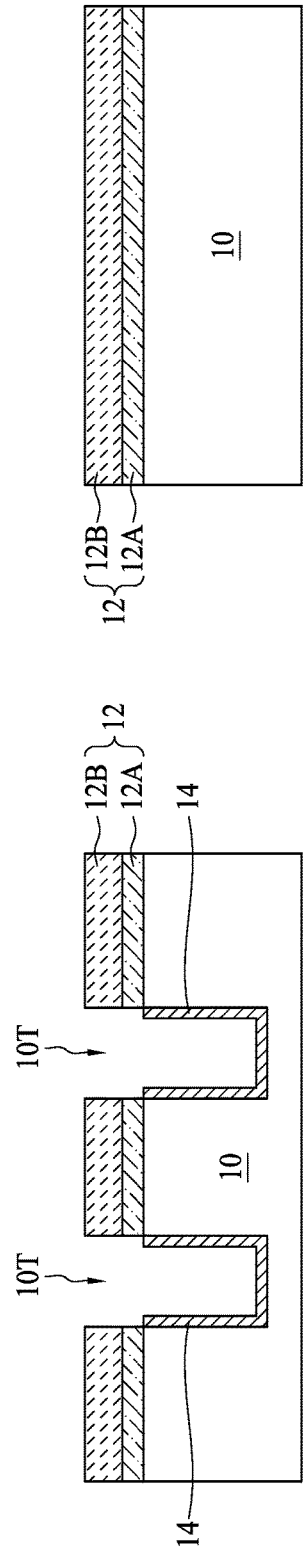
FIG. 4B
FIG. 4A

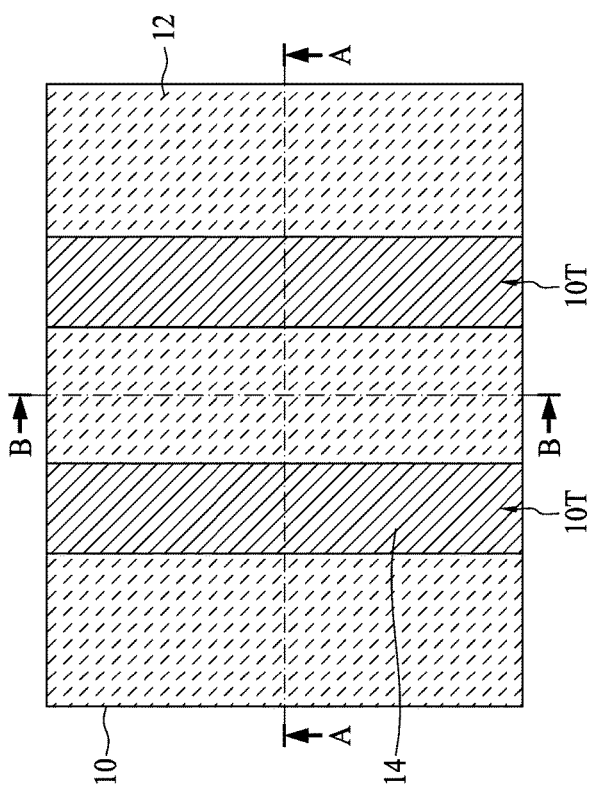
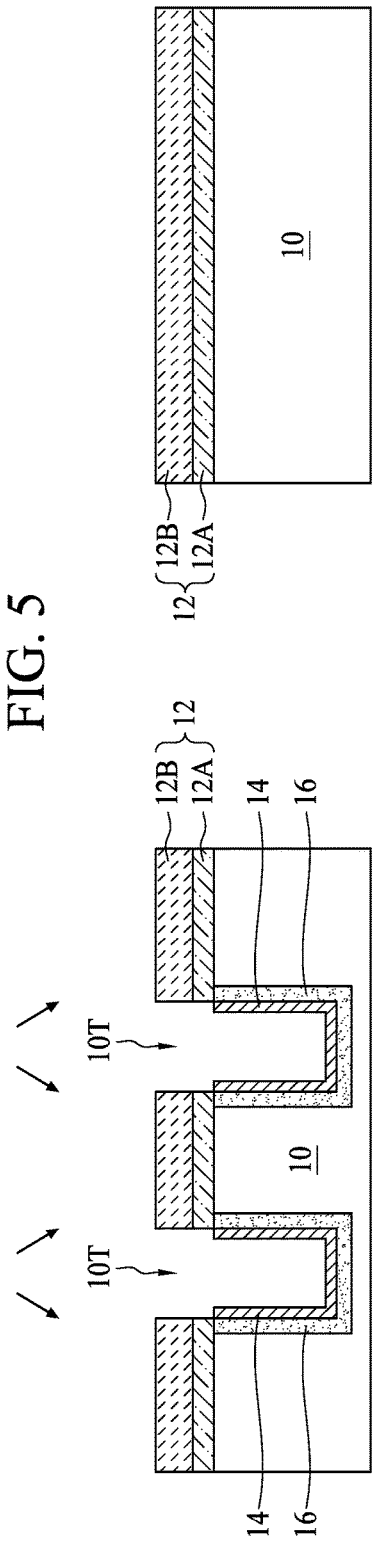
FIG. 5
FIG. 5A
FIG. 5B

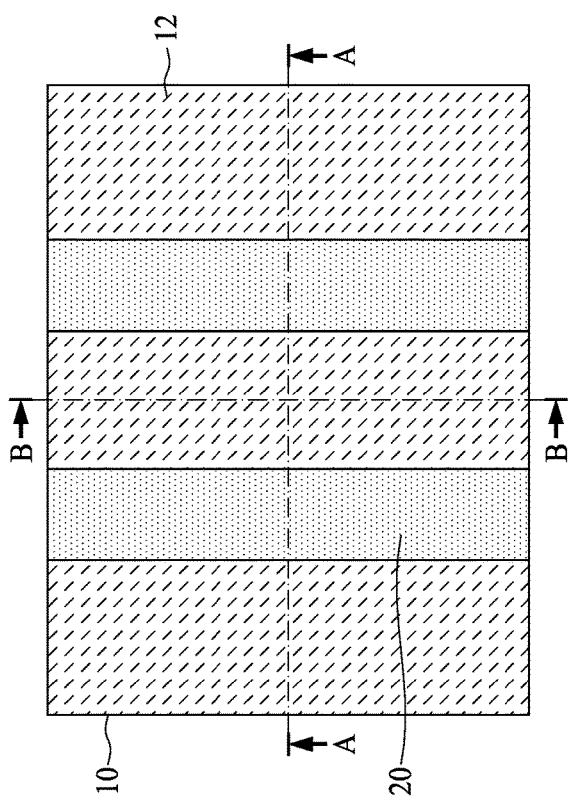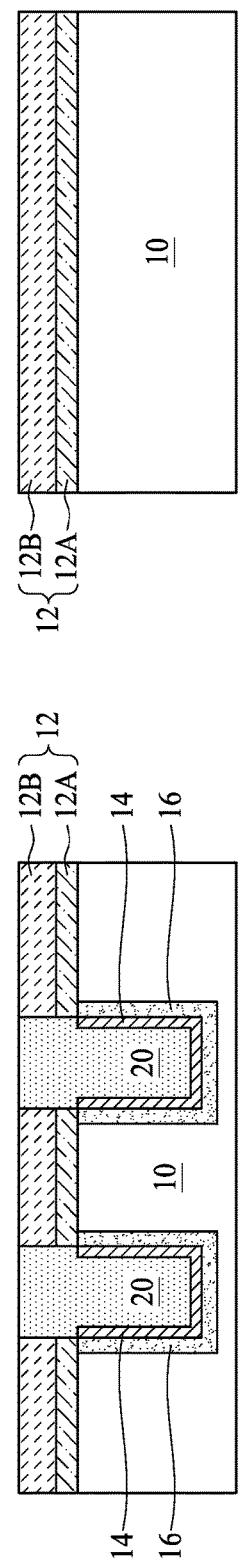
FIG. 6
FIG. 6A
FIG. 6B

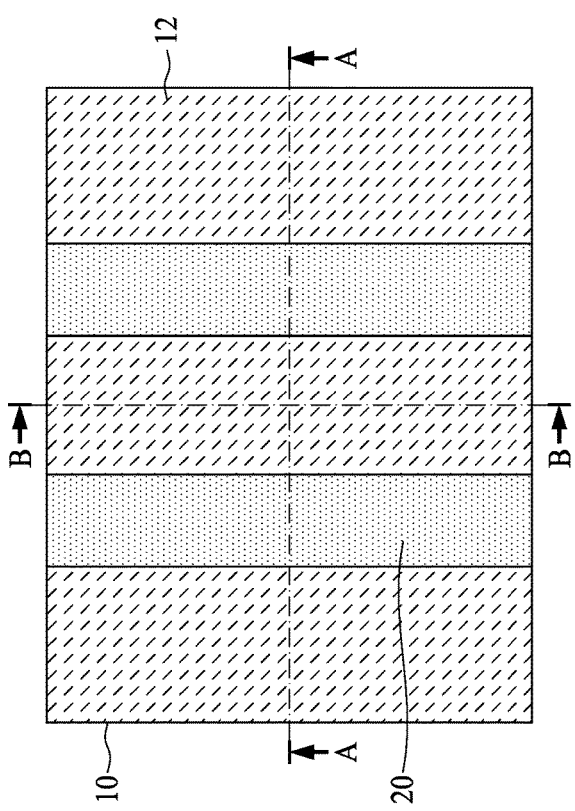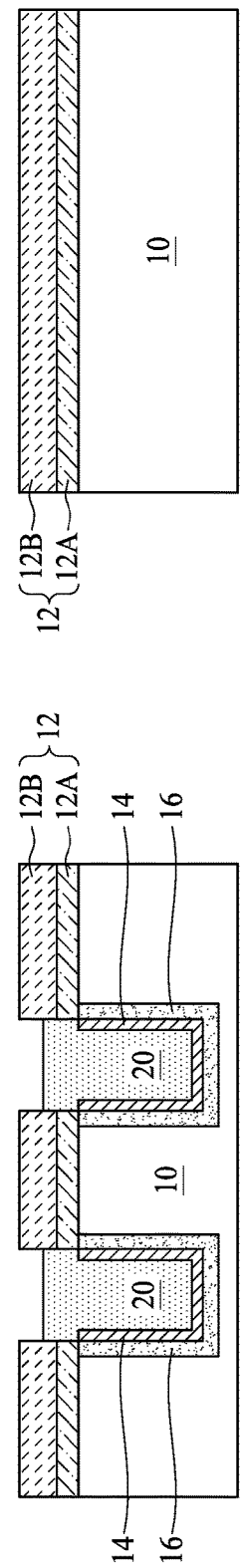

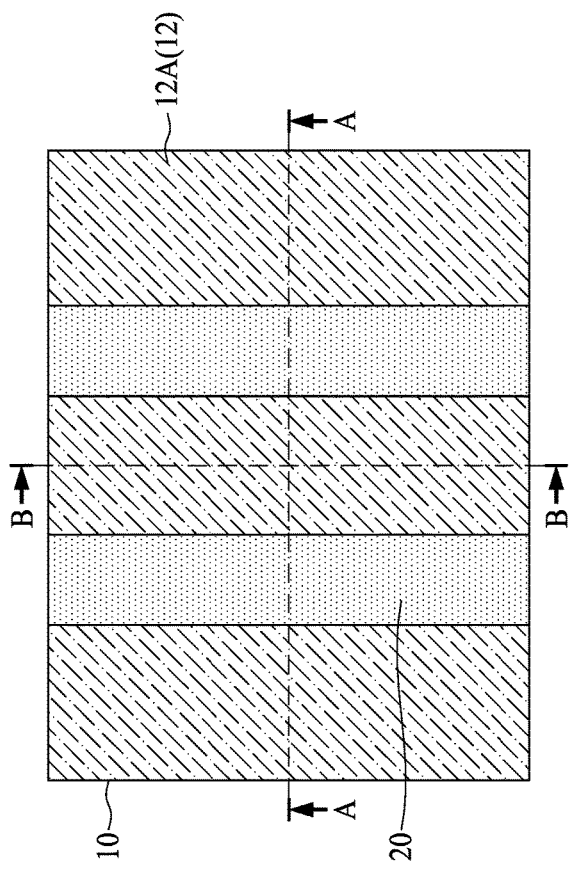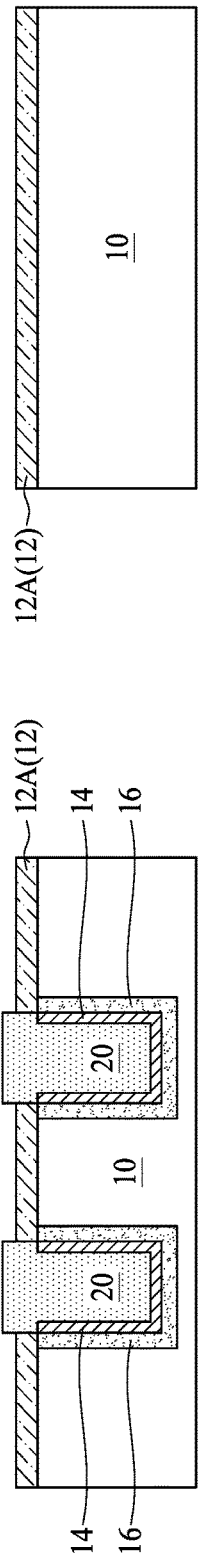

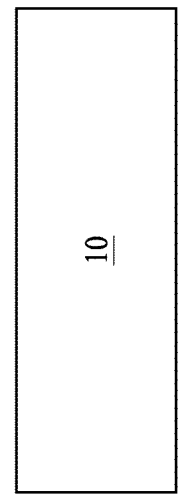
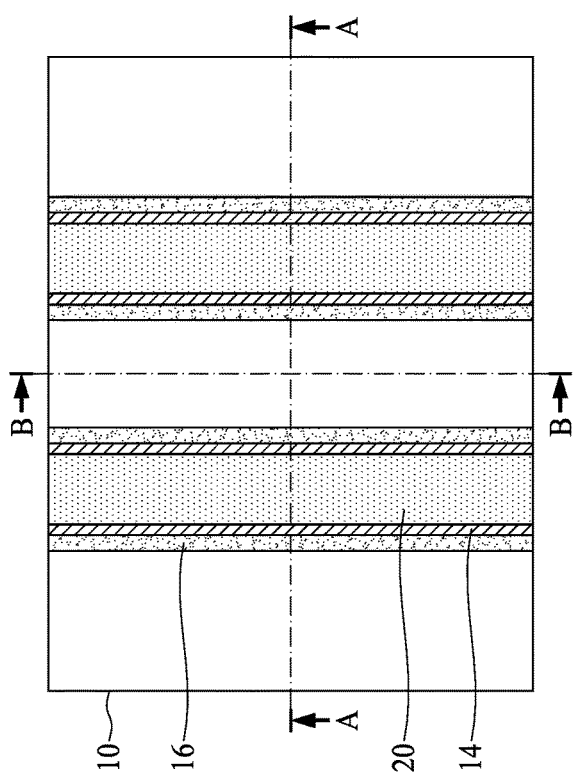
FIG. 9
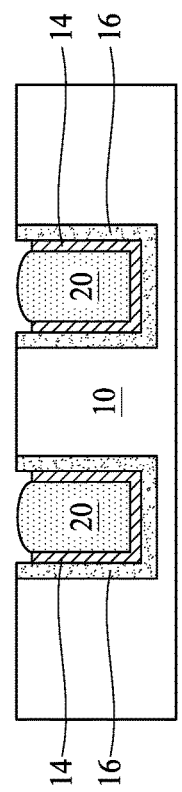

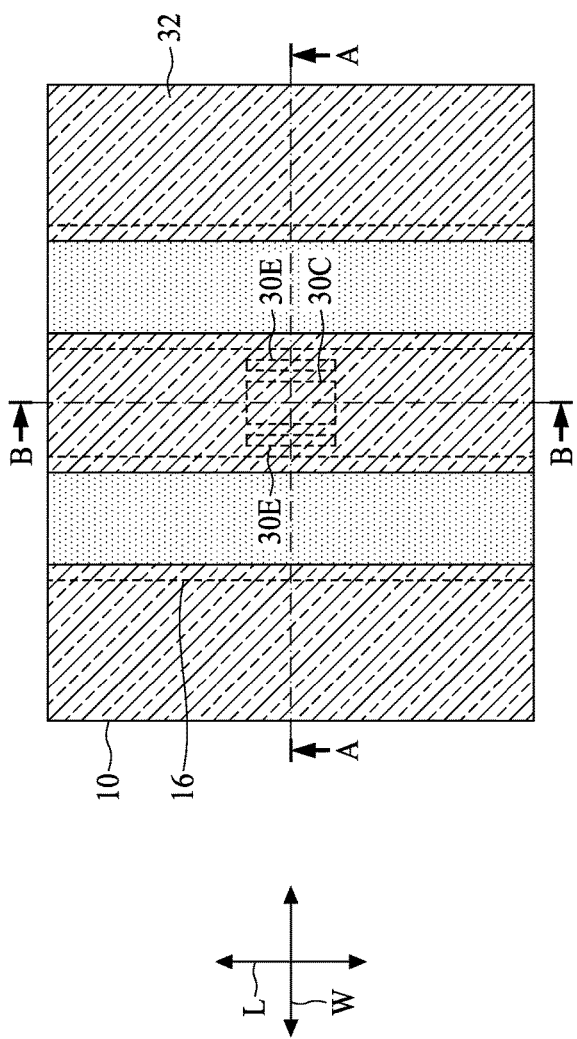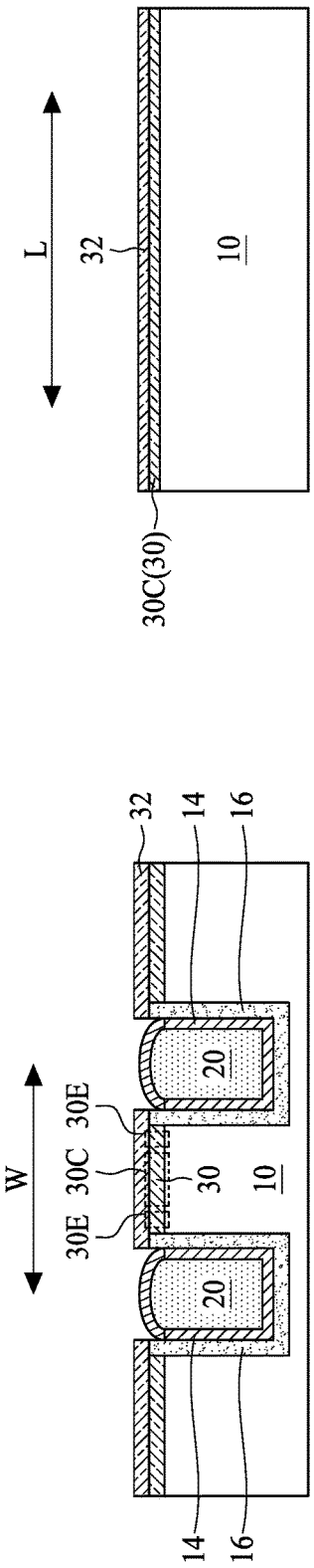

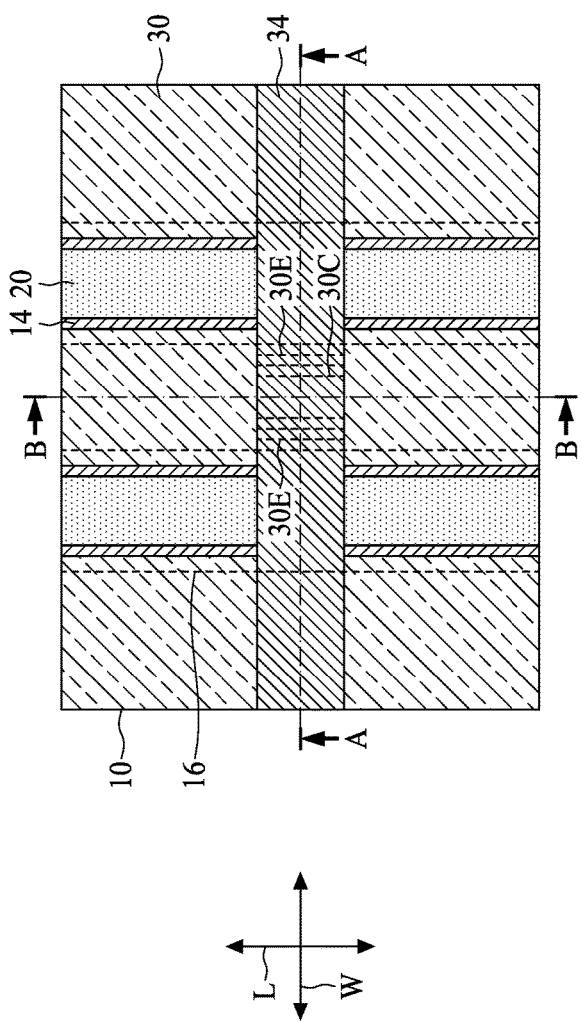
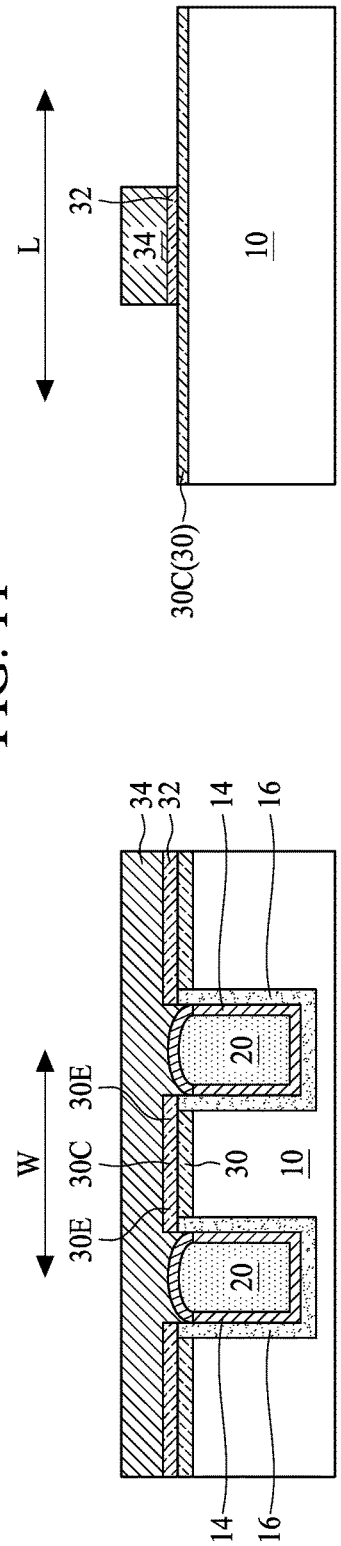
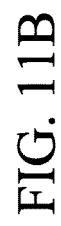
FIG. 11
FIG. 11A
FIG. 11B

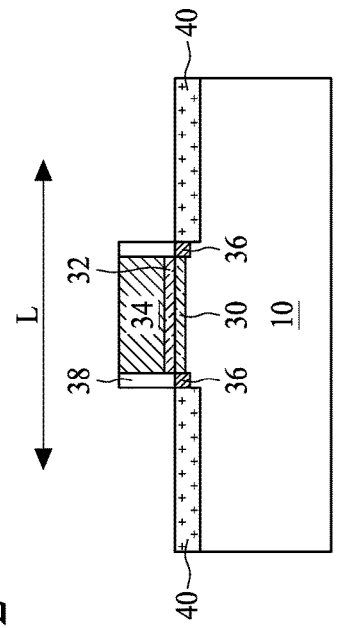
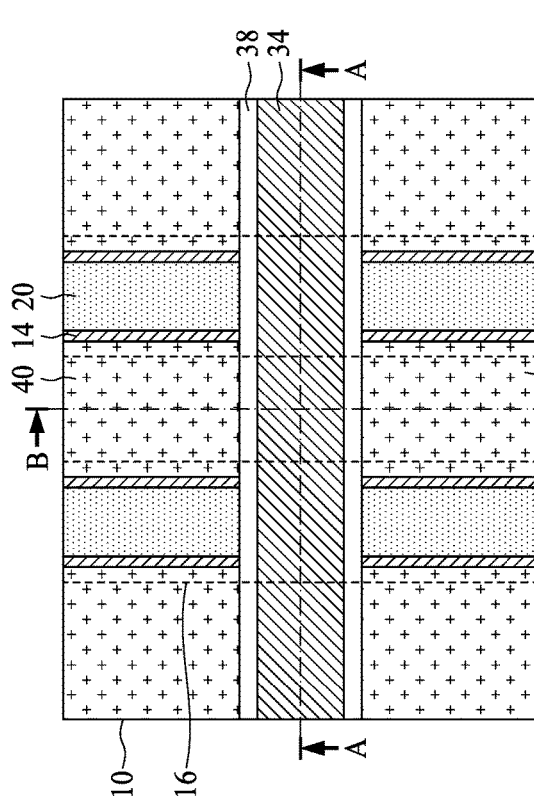
FIG. 12
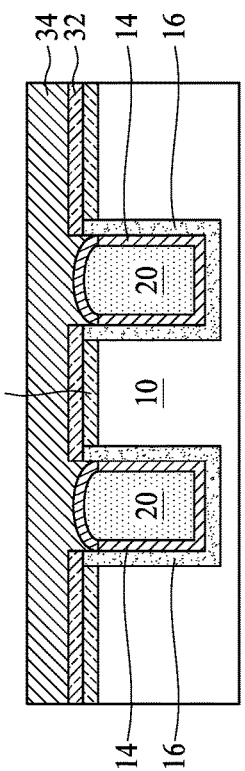

US 10,340,343 B2

SEMICONDUCTOR DEVICE AND METHOD FOR MANUFACTURING THE SAME

PRIORITY CLAIM AND CROSS-REFERENCE

This application claims priority of U.S. provisional application Ser. No. 62/579,513 filed on Oct. 31, 2017, which is incorporated by reference in its entirety.

BACKGROUND

Semiconductor devices such as field effect transistors (FETs) are suffered from flicker noise issue. The flicker noise is considered to be caused by trapping and de-trapping of charge carriers. The flicker noise degradation can be an important issue for both low frequency analog circuit and high performance digital circuit, and thus reduction of flicker noise is desired.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 2, FIG. 2A, FIG. 2B, FIG. 3, FIG. 3A, FIG. 3B, FIG. 4, FIG. 4A, FIG. 4B, FIG. 5, FIG. 5A, FIG. 5B, FIG. 6, FIG. 6A, FIG. 6B, FIG. 7, FIG. 7A, FIG. 7B, FIG. 8, FIG. 8A, FIG. 8B, FIG. 9, FIG. 9A, FIG. 9B, FIG. 10, FIG. 10A, FIG. 10B, FIG. 11, FIG. 11A, FIG. 11B, FIG. 12, FIG. 12A, FIG. 12B and FIG. 13 are schematic views at one of various operations of manufacturing a semiconductor device according to one or more embodiments of the present disclosure.

DETAILED DESCRIPTION

Figure 1:
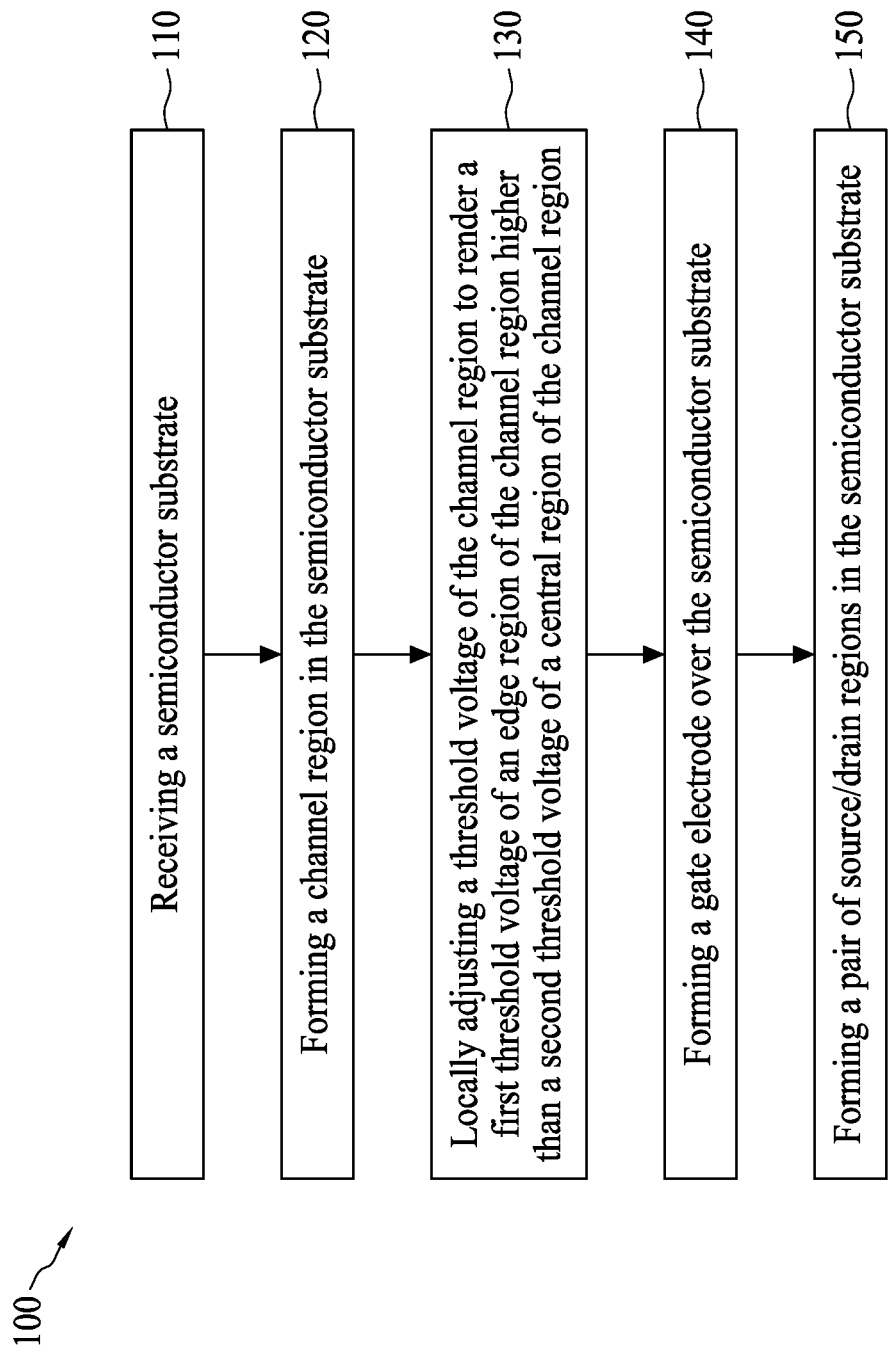
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, the semiconductor device including a threshold voltage adjusting region to locally adjust the threshold voltage is provided. The threshold voltage adjusting region is disposed adjoining to a channel region in a channel width direction. In some embodiments, the threshold voltage adjusting region has the same doping type as the channel region, but higher doping concentration. The threshold voltage adjusting region with higher doping concentration may help to decrease the drain current due to defects in the proximity of the channel region, and thus increase the threshold voltage of an edge region of the channel region proximal to the threshold voltage adjusting region. Thus, flicker noise issue can be alleviated. The threshold voltage adjusting region is configured not to affect the threshold voltage of the channel distal to the threshold voltage adjusting region, and thus the semiconductor device may be turned on by a preset threshold voltage. In some embodiments, the threshold voltage adjusting region is formed in the sidewall of the trench using the sacrificial pad layer for patterning the trench as a mask, and thus may not require additional mask. The threshold voltage adjusting region may be a liner doped region in the sidewall of the trench, and thus the layout area is not substantially affected.

FIG. 1 is a flow chart illustrating a method for manufacturing a semiconductor device according to various aspects of one or more embodiments of the present disclosure. The method 100 begins with operation 110 in which a semiconductor substrate is received. The method 100 proceeds with operation 120 in which a channel region is formed in the semiconductor substrate. The method 100 continues with operation 130 in which a threshold voltage of the channel region is locally adjusted to render a first threshold voltage of an edge region of the channel region higher than a second threshold voltage of a central region of the channel region. The method 100 proceeds with operation 140 in which a gate electrode is formed over the semiconductor substrate. The method 100 continues with operation 150 in which a pair of source/drain regions are formed in the semiconductor substrate.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

FIG. 2, FIG. 2A, FIG. 2B, FIG. 3, FIG. 3A, FIG. 3B, FIG. 4, FIG. 4A, FIG. 4B, FIG. 5, FIG. 5A, FIG. 5B, FIG. 6, FIG. 6A, FIG. 6B, FIG. 7, FIG. 7A, FIG. 7B, FIG. 8, FIG. 8A, FIG. 8B, FIG. 9, FIG. 9A, FIG. 9B, FIG. 10, FIG. 10A, FIG. 10B, FIG. 11, FIG. 11A, FIG. 11B, FIG. 12, FIG. 12A, FIG. 12B and FIG. 13 are schematic views at one of various operations of manufacturing a semiconductor device according to one or more embodiments of the present disclosure. Refer to FIG. 2, FIG. 2A and FIG. 2B. FIG. 2 is a schematic top view at one of various operations of manufacturing a semiconductor device according to some embodiments of the present disclosure, FIG. 2A is a schematic cross-sectional view along line A-A of FIG. 2, and FIG. 2B is a schematic cross-sectional view along line B-B of FIG. 2. A semiconductor substrate 10 is received. In some embodiments, the material of the semiconductor substrate 10 may comprise elementary semiconductor such as silicon or germanium; a compound semiconductor such as silicon germanium, silicon carbide, gallium arsenic, gallium phosphide, indium phosphide or indium arsenide; or combinations thereof.

Refer to FIG. 3, FIG. 3A and FIG. 3B. FIG. 3 is a schematic top view at one of various operations of manufacturing a semiconductor device according to some embodiments of the present disclosure, FIG. 3A is a schematic cross-sectional view along line A-A of FIG. 3, and FIG. 3B is a schematic cross-sectional view along line B-B of FIG. 3. A sacrificial pad layer 12 is formed over the semiconductor substrate 10. In some embodiments, the sacrificial pad layer 12 is configured to define a location of a trench to be formed, and will be removed subsequently. The sacrificial pad layer 12 may be single-layered or multi-layered. By way of example, the sacrificial pad layer 12 may include a pad oxide layer 12A (such as a silicon oxide layer), and a pad nitride layer 12B (such as a silicon nitride layer) stacked on the pad oxide layer 12A. In some embodiments, the pad oxide layer 12A is thinner than the pad nitride layer 12B. For example, the thickness of the pad oxide layer 12A is substantially in a range from about 50 angstroms to about 200 angstroms, and the thickness of the pad nitride layer 12B is substantially in a range from about 1000 angstroms to about 2000 angstroms, but not limited thereto. The sacrificial pad layer 12 is then patterned to expose a portion of the semiconductor substrate 10. By way of example, the sacrificial pad layer 12 may be patterned by photolithography techniques using a photoresist layer along with a hard mask layer. The semiconductor substrate 10 exposed from the patterned sacrificial pad layer 12 is then recessed to form one or more trenches 10T. In some embodiments, the trench 10T is configured to accommodate an isolation structure such as a shallow trench isolation (STI). By way of example, the semiconductor substrate 10 exposed from the patterned sacrificial pad layer 12 may be removed by etching techniques. In some embodiments, the depth of the trench 10T is smaller than the thickness of the semiconductor substrate 10 such that the trench 10T does not penetrate the semiconductor substrate 10.

Refer to FIG. 4, FIG. 4A and FIG. 4B. FIG. 4 is a schematic top view at one of various operations of manufacturing a semiconductor device according to some embodiments of the present disclosure, FIG. 4A is a schematic cross-sectional view along line A-A of FIG. 4, and FIG. 4B is a schematic cross-sectional view along line B-B of FIG. 4. In some embodiments, a liner insulation layer 14 may be formed on the sidewall and the bottom of the trench 10T. In some embodiments, the liner insulation layer 14 may include a liner oxide layer such as a silicon oxide layer. By way of example, the liner insulation layer 14 may be formed by thermal oxidation, but not limited thereto. In some embodiments, an anneal may be performed at a temperature from about 1000° C. to about 1200° C. for about 1-5 hours, but not limited thereto. In some embodiments, the thickness of the liner insulation layer 14 is substantially in a range from about 50 angstroms to about 200 angstroms, but not limited thereto.

Refer to FIG. 5, FIG. 5A and FIG. 5B. FIG. 5 is a schematic top view at one of various operations of manufacturing a semiconductor device according to some embodiments of the present disclosure, FIG. 5A is a schematic cross-sectional view along line A-A of FIG. 5, and FIG. 5B is a schematic cross-sectional view along line B-B of FIG. 5. A threshold voltage adjusting region 16 is formed in the sidewall and the bottom of the trench 10T. In some embodiments, the threshold voltage adjusting region 16 may include a doped region. The doping type of the threshold voltage adjusting region 16 may be selected based on the types of the semiconductor device to be fabricated. If the semiconductor device is an N type FET such as NMOS, the dopants of the threshold voltage adjusting region 16 may be P type dopants such as Indium or the like. If the semiconductor device is a P type FET such as PMOS, the dopants of the threshold voltage adjusting region 16 may be N type dopants such as Arsenic, Antimony or the like. In some embodiments, the threshold voltage adjusting region 16 may be formed by ion implantation, but not limited thereto. In some alternative embodiments, the threshold voltage adjusting region 16 may be formed by other suitable doping techniques. In some embodiments, the ion implantation is performed at a tilt angle (shown by the arrows) such that the threshold voltage adjusting region 16 can be formed in the sidewall of the trench 10T. In some embodiments, the tilt angle is in a range from about 15° to about 40°, but not limited thereto. For example, the tilt angle of the ion implantation may be modified based on the dimension of the opening and the depth of the trench 10T. In some embodiments, the dosage of the ion implantation is substantially in a range from $5*10^{12}$ atoms/cm$^2$ to $5*10^{13}$ atoms/cm$^2$, but not limited thereto. For example, the dosage of the ion implantation may be modified based on the doping concentration of the threshold voltage adjusting region 16. In some embodiments, the thickness of the threshold voltage adjusting region 16 in a direction substantially perpendicular to the sidewall of the trench 10T is in a range from 0.02 micrometers to 0.1 micrometers, but not limited thereto. In some embodiments, the energy of the ion implantation is substantially in a range from 20 KeV to 50 KeV, but not limited thereto. For example, the energy of the ion implantation may be modified based on the target thickness of the threshold voltage adjusting region 16. In some embodiments, an anneal may be performed after the ion implantation to diffuse the dopants. In some embodiments, the anneal is performed at a temperature in a range from about 900° C. to 1100° C. for about 5-30 seconds, but not limited thereto.

Refer to FIG. 6, FIG. 6A and FIG. 6B. FIG. 6 is a schematic top view at one of various operations of manufacturing a semiconductor device according to some embodiments of the present disclosure, FIG. 6A is a schematic cross-sectional view along line A-A of FIG. 6, and FIG. 6B is a schematic cross-sectional view along line B-B of FIG. 6. An isolation structure 20 such as a shallow trench isolation (STI) is formed in the trench 10T. In some embodiments, the isolation structure 20 is formed by depositing an oxide layer e.g., a silicon oxide layer, over the sacrificial pad layer 12 and in the trench 10T. The oxide layer may be then partially removed e.g., by a chemical mechanical polishing (CMP).

Refer to FIG. 7, FIG. 7A and FIG. 7B. FIG. 7 is a schematic top view at one of various operations of manufacturing a semiconductor device according to some embodiments of the present disclosure, FIG. 7A is a schematic cross-sectional view along line A-A of FIG. 7, and FIG. 7B is a schematic cross-sectional view along line B-B of FIG. 7. In some embodiments, the isolation structure 20 may be partially recessed by e.g., etching, such that the isolation structure 20 is recessed from the pad nitride layer 12B.

Refer to FIG. 8, FIG. 8A and FIG. 8B. FIG. 8 is a schematic top view at one of various operations of manufacturing a semiconductor device according to some embodiments of the present disclosure, FIG. 8A is a schematic cross-sectional view along line A-A of FIG. 8, and FIG. 8B is a schematic cross-sectional view along line B-B of FIG. 8. In some embodiments, the pad nitride layer 12B is removed by e.g., etching. In some embodiments, one or more ion implantations may be formed after the pad nitride layer 12B is removed, so as to form one or more wells in the semiconductor substrate 10. For example, P type doped well and N type doped well may be formed at different locations of the semiconductor substrate 10, and configured as the wells for different types of semiconductor devices such as PMOS and NMOS. In some embodiments, an anneal may be performed after the ion implantation(s).

Refer to FIG. 9, FIG. 9A and FIG. 9B. FIG. 9 is a schematic top view at one of various operations of manufacturing a semiconductor device according to some embodiments of the present disclosure, FIG. 9A is a schematic cross-sectional view along line A-A of FIG. 9, and FIG. 9B is a schematic cross-sectional view along line B-B of FIG. 9. The pad oxide layer 12A is then removed by e.g., etching. In some embodiments, a portion of the isolation structure 20 may be removed along with the pad oxide layer 12A. In some embodiments, a sacrificial layer such as a sacrificial oxide layer (not shown) may be formed over the semiconductor substrate 10. The sacrificial layer may be then removed from the semiconductor substrate 10. In some embodiments, the sacrificial layer may be configured to repair and modify the surface condition of the semiconductor substrate 10.

Refer to FIG. 10, FIG. 10A and FIG. 10B. FIG. 10 is a schematic top view at one of various operations of manufacturing a semiconductor device according to some embodiments of the present disclosure, FIG. 10A is a schematic cross-sectional view along line A-A of FIG. 10, and FIG. 10B is a schematic cross-sectional view along line B-B of FIG. 10. In some embodiments, a channel region 30 is formed in the semiconductor substrate 10. By way of example, the channel region 30 may be formed by ion implantation. The threshold voltage adjusting region 16 is disposed on two opposing sides of the channel region 30 in a channel width direction W. In some embodiments, the threshold voltage adjusting region 16 is disposed between the isolation structure 20 and the channel region 30. In some embodiments, the threshold voltage adjusting region 16 and the channel region 30 have the same doping type. For example, if an N type FET is to be formed, the threshold voltage adjusting region 16 and the channel region 30 are P type; if a P type FET is to be formed, the threshold voltage adjusting region 16 and the channel region 30 are N type.

In some embodiments, the dopant concentration of the threshold voltage adjusting region 16 is higher than the dopant concentration of the channel region 30. For example, a ratio of the doping concentration of the threshold voltage adjusting region to the doping concentration of the channel region is substantially in a range from about 1.1 to about 2.0, but not limited thereto. In some embodiments, the threshold voltage adjusting region 16 is adjoining to an edge region 30E of the channel region 30 in the channel width direction W. By virtue of the threshold voltage adjusting region 16, a first threshold voltage at the edge region 30E is higher than a second threshold voltage in the central region 30C. The threshold voltage adjusting region 16 helps to increase the threshold voltage and reduce drain current at the edge region 30E, and thus can inhibit flicker noise generated due to defects in the proximity of the channel region 30. By way of example, defects tend to occur at the corner of the isolation structure 20. The threshold voltage adjusting region 16 located between the isolation structure 20 and the channel region 30 can help to alleviate the flicker noise generated from the defects of the isolation structure 20.

Figure 14:
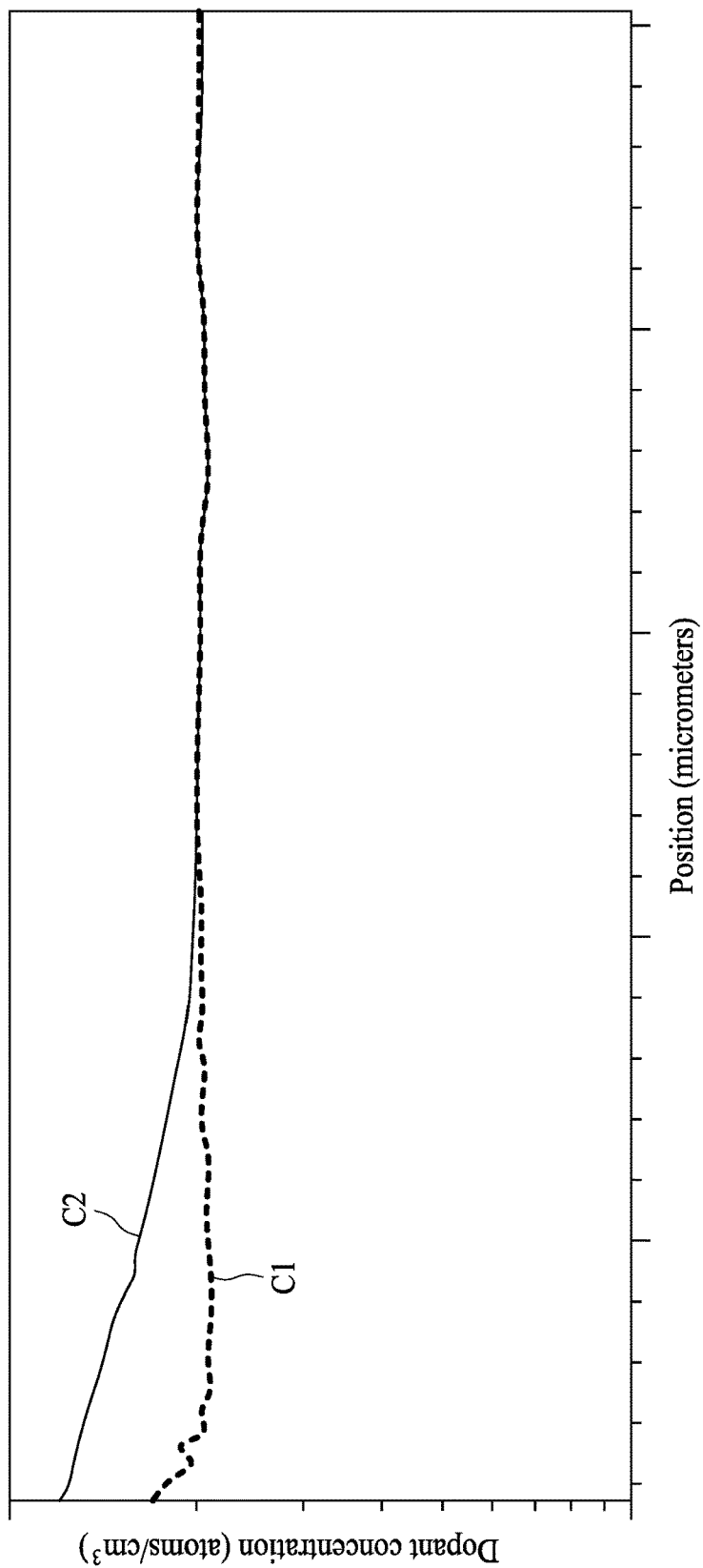
FIG. 14 is a chart illustrating a doping profile of a threshold voltage adjusting region and a channel region

Refer to FIG. 14. FIG. 14 is a chart illustrating a doping profile of a threshold voltage adjusting region and a channel region, wherein curve C1 represents a doping profile of a channel region without a threshold voltage adjusting region of a comparative embodiment, and curve C2 represents a doping profile of a channel region with a threshold voltage adjusting region of some embodiments of the present disclosure. As shown in FIG. 14, the threshold voltage adjusting region 16 with higher doping concentration is configured to increase the threshold voltage of the edge region 30E of the channel region 30, while the doping concentrations of the channel region 30 with and without the threshold voltage adjusting region 16 are substantially the same. Thus, the threshold voltage of the central region 30C of the channel region 30 is substantially unaffected when the threshold voltage adjusting region 16 is integrated.

In some embodiments, a ratio of the first threshold voltage at the edge region 30E to the second threshold voltage in the central region 30C is substantially in a range from about 1.1 to about 1.5. In some exemplary embodiments, the first threshold voltage at the edge region 30E of the channel region 30 is higher than the second threshold voltage in the central region 30C of the channel region 30 by about 30-100 mV, but not limited thereto. In some embodiments, the current density at the edge region 30E of the channel region 30 is lower than the current density in the central region 30C of the channel region 30 by about 2-5 times. In some embodiments, a ratio of the width of the edge region 30E to a width of the channel region 30 in the channel width direction W is substantially in a range from about 0.02 to about 0.1. By way of example, for an analogic MOS having a channel width of about 1 micrometer or wider, the width of the edge region 30E is substantially in a range from about 0.02 micrometers to about 0.1 micrometers.

In some embodiments, a gate insulator 32 such as a silicon oxide layer is formed over the semiconductor substrate 10.

Refer to FIG. 11, FIG. 11A and FIG. 11B. FIG. 11 is a schematic top view at one of various operations of manufacturing a semiconductor device according to some embodiments of the present disclosure, FIG. 11A is a schematic cross-sectional view along line A-A of FIG. 11, and FIG. 11B is a schematic cross-sectional view along line B-B of FIG. 11. A gate electrode 34 is formed over the gate insulator 32. In some embodiments, the gate electrode 34 may include a polycrystalline silicon gate electrode, or the like.

Refer to FIG. 12, FIG. 12A and FIG. 12B. FIG. 12 is a schematic top view at one of various operations of manufacturing a semiconductor device according to some embodiments of the present disclosure, FIG. 12A is a schematic cross-sectional view along line A-A of FIG. 12, and FIG. 12B is a schematic cross-sectional view along line B-B of FIG. 12. In some embodiments, a pair of lightly-doped regions 36 may be formed on two opposing sides of the channel region 30 in a channel length direction L. By way of example, the lightly-doped regions 36 are formed by ion implantation. In some embodiments, spacers 38 may be formed on two opposing sidewalls of the gate electrode 34. The spacer 38 may include a single-layered spacer such as a silicon oxide spacer. In some other embodiments, the spacer 38 may include a multi-layered spacer such as a stack of a silicon oxide spacer and a silicon nitride spacer. In some embodiments, a pair of source/drain regions may be formed on two opposing sides of the channel region 30 in the channel length direction L to form a semiconductor device 1. By way of example, the source/drain regions 40 are formed by ion implantation. In some embodiments, the doping type of the lightly doped regions 36 and the source/drain regions 40 is complementary to that of the channel region 30 and the threshold voltage adjusting region 16. In some embodiments, a salicidation may be performed to form silicide compounds (not shown) on the surfaces of the gate electrode 34 and/or the source/drain regions 40.

Figure 13:
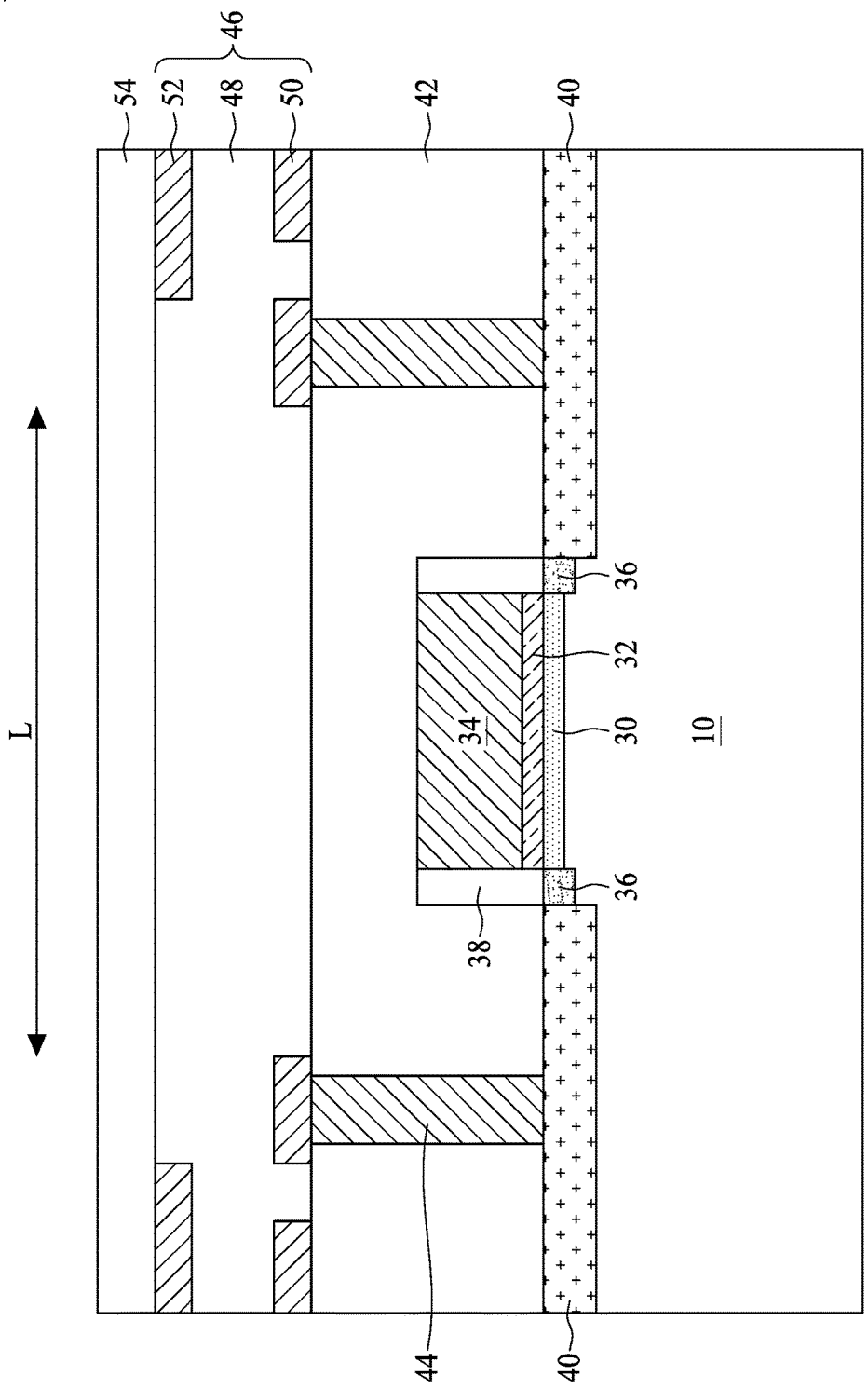

Refer to FIG. 13. FIG. 13 is a schematic top view at one of various operations of manufacturing a semiconductor device according to some embodiments of the present disclosure. In some embodiments, at least one inter layer dielectric (ILD) 42 may be formed over the semiconductor device 1. In some embodiments, a plurality of contact vias 44 electrically connecting the source/drain regions 40 and/or the gate electrode 34 may be formed, respectively. In some embodiments, a back end of line (BEOL) metallization operation may be performed to build electrical routing. In some embodiments, the BEOL metallization 46 may include at least one inter metal dielectric (IMD) 48, and one or more conductive layers such as a bottom metal layer 50 and a top metal layer 52. In some embodiments, a passivation layer 54 may be formed over the BEOL metallization 46 to protect the semiconductor device 1.

In an integrated circuit (IC) having various types of semiconductor devices formed thereon, the threshold voltage adjusting region 16 may be formed in some semiconductor devices, while other semiconductor devices may not be incorporated with the threshold voltage adjusting region 16. For example, low frequency analog devices and high performance digital devices which are suffered from flicker noise issue may be integrated with the threshold voltage adjusting region 16, while other semiconductor devices may not be incorporated with the threshold voltage adjusting region 16. In some embodiments, the threshold voltage adjusting regions 16 of different types of semiconductor devices may have different doping concentrations.

In some embodiments of the present disclosure, the semiconductor device includes a threshold voltage adjusting region adjoining to a channel region in a channel width direction. The threshold voltage adjusting region has the same doping type as the channel region, but higher doping concentration. The threshold voltage adjusting region with higher doping concentration may help to decrease the drain current from the STI corner due to defects, and thus increase the threshold voltage of an edge region of the channel region proximal to the threshold voltage adjusting region. Thus, flicker noise issue can be alleviated. The threshold voltage adjusting region is configured not to affect the threshold voltage of the channel distal to the threshold voltage adjusting region, and thus the semiconductor device may be turned on by a preset threshold voltage. In some embodiments, the threshold voltage adjusting region is formed in the sidewall of the trench using the sacrificial pad layer to pattern the trench as a mask, and thus may not require additional mask. The threshold voltage adjusting region may be a liner doped region in the sidewall of the trench, and thus the layout area is not substantially affected.

In one exemplary aspect, a semiconductor device includes a semiconductor substrate, a gate electrode, a pair of source/drain regions and a a threshold voltage adjusting region. The gate electrode is over the semiconductor substrate. The channel region is between the semiconductor substrate and the gate electrode. The source/drain regions are adjacent to two opposing sides of the channel region in a channel length direction. The threshold voltage adjusting region is adjacent to two opposing sides of the channel region in a channel width direction, wherein the threshold voltage adjusting region and the channel region have the same doping type.

In another exemplary aspect, a semiconductor device includes a semiconductor substrate, a gate electrode, a channel region and a pair of source/drain electrodes. The gate electrode is over the semiconductor substrate. The channel region is between the semiconductor substrate and the gate electrode, wherein the channel region includes a central region, and an edge region adjoining to the central region in a channel width direction. The source/drain regions are adjacent to two opposing sides of the channel region in a channel length direction, wherein a first threshold voltage of the semiconductor device at the edge region is higher than a second threshold voltage of the semiconductor device in the central region.

In yet another exemplary aspect, a method for manufacturing a semiconductor device is provided. A semiconductor substrate is received. A channel region is formed in the semiconductor substrate. A threshold voltage of the channel region is locally adjusted to render a first threshold voltage of an edge region of the channel region higher than a second threshold voltage of a central region of the channel region.

A gate electrode is formed over the semiconductor substrate. A pair of source/drain regions is formed in the semiconductor substrate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a gate electrode over the semiconductor substrate;
a channel region between the semiconductor substrate and the gate electrode;
a pair of source/drain regions adjacent to two opposing sides of the channel region in a channel length direction; and
a threshold voltage adjusting region adjacent to two opposing sides of the channel region in a channel width direction, wherein the threshold voltage adjusting region and the channel region have the same doping type, and a depth of the threshold voltage adjusting region is greater than a depth of the pair of source/drain regions.

2. The semiconductor device of claim 1, further comprising an isolation structure in the semiconductor substrate.

3. The semiconductor device of claim 2, wherein the isolation structure comprises a shallow trench isolation (STI) in a trench of the semiconductor substrate.

4. The semiconductor device of claim 3, wherein the threshold voltage adjusting region is in a sidewall of the STI.

5. The semiconductor device of claim 1, wherein a doping concentration of the threshold voltage adjusting region is higher than a doping concentration of the channel region.

6. The semiconductor device of claim 5, wherein a ratio of the doping concentration of the threshold voltage adjusting region to the doping concentration of the channel region is substantially in a range from about 1.1 to about 2.0.

7. The semiconductor device of claim 5, wherein the channel region includes an edge region proximal to the threshold voltage adjusting region, and a central region distal to the threshold voltage adjusting region, and a first threshold voltage at the edge region is higher than a second threshold voltage of in the central region.

8. The semiconductor device of claim 7, wherein a ratio of the first threshold voltage to the second threshold voltage is substantially in a range from 1.1 to 1.5.

9. The semiconductor device of claim 7, wherein a ratio of a width of the edge region to a width of the channel region in the channel width direction is substantially in a range from about 0.02 to about 0.1.

10. The semiconductor device of claim 1, further comprising a pair of lightly-doped regions on the two opposing sides of the channel region in the channel length direction, and between the channel region and the pair of source/drain regions respectively, wherein a doping type of the pair of the lightly-doped regions and the pair of source/drain regions is complementary to the doping type of the channel region and the threshold voltage adjusting region.

11. A semiconductor device, comprising:
a semiconductor substrate;
an isolation structure in the semiconductor substrate;
a gate electrode over the semiconductor substrate;
a channel region between the semiconductor substrate and the gate electrode, wherein the channel region includes a central region, and an edge region adjoining to the central region in a channel width direction;
a pair of source/drain regions adjacent to two opposing sides of the channel region in a channel length direction; and
a threshold voltage adjusting region adjacent to two opposing sides of the channel region in the channel width direction, and in a sidewall and a bottom of the isolation structure,
wherein a first threshold voltage of the semiconductor device at the edge region is higher than a second threshold voltage of the semiconductor device in the central region.

12. The semiconductor device of claim 11, wherein a ratio of the first threshold voltage to the second threshold voltage is substantially in a range from 1.2 to 1.4.

13. The semiconductor device of claim 11, further comprising a threshold voltage adjusting region adjacent to the edge region of the channel region in the channel width direction.

14. The semiconductor device of claim 13, wherein a ratio of a width of the edge region to a width of the channel region in the channel width direction is substantially in a range from about 0.02 to about 0.1.

15. The semiconductor device of claim 13, wherein the isolation structure comprises a shallow trench isolation (STI) in a trench of the semiconductor substrate.

16. A method for manufacturing a semiconductor device, comprising:
receiving a semiconductor substrate;
forming a channel region in the semiconductor substrate;
forming a threshold voltage adjusting region in a sidewall and a bottom of an isolation structure to locally adjust a threshold voltage of the channel region to render a first threshold voltage of an edge region of the channel region higher than a second threshold voltage of a central region of the channel region;
forming a gate electrode over the semiconductor substrate; and
forming a pair of source/drain regions in the semiconductor substrate.

17. The method of claim 16, wherein the threshold voltage adjusting region and the channel region have the same doping type, and a doping concentration of the threshold voltage adjusting region is higher than a doping concentration of the channel region.

18. The method of claim 16, further comprising:
recessing the semiconductor substrate to form a trench;
performing an ion implantation to form a threshold voltage adjusting region in a sidewall and a bottom of the trench; and
forming a trench isolation in the trench.

19. The method of claim 18, wherein the ion implantation is performed at a tilt angle.

* * * * *